Sept. 7, 1965 H. I. SWANSON 3,205,456
LOW FREQUENCY AUDIO DISTORTION REDUCTION
CIRCUIT FOR TRANSMITTERS
Filed Feb. 1, 1963

INVENTOR.
HILMER I. SWANSON
BY Moody & Anderson
AGENTS

United States Patent Office 3,205,456

Patented Sept. 7, 1965

3,205,456

LOW FREQUENCY AUDIO DISTORTION REDUCTION CIRCUIT FOR TRANSMITTERS

Hilmer I. Swanson, Cedar Rapids, Iowa, assignor to Collins Radio Company, Cedar Rapids, Iowa, a corporation of Iowa Filed Feb. 1, 1963, Ser. No. 255,477
5 Claims. (Cl. 332—37)

This invention relates to modulation techniques is transmitters and more particularly to a means for reducing distortion in a plate modulation circuit at low modulating frequencies.

In plate modulating power amplifiers, the modulator power required to produce 100 percent modulation is one-half of the power amplifier input. A well-known technique utilized, especially in high power transmitters employing plate modulation, is that of incorporating a pi-filter method of supplying the D.C. current. The pi-filter method allows improved audio quality and permits reduction in size of components. The technique, however, may introduce a high distortion at low modulating frequencies when the same D.C. power source is utilized for both the modulating amplifier and the modulated R.F. output amplifier. Generally speaking, the low frequency modulating signal appears on the B+ line if the power supply has any appreciable impedance. Distortion is inherent at low modulating frequency in systems utilizing the pi-filter method of supplying the D.C. current unless the impedance of the power supply is negligibly low. The impedance of the power supply might be lowered by using a very large number of filter capacitors or by using a battery source for this purpose. However, each of these expedients is most times impracticable as a solution to the problem.

An object, therefore, of the present invention, is to provide a means for reducing distortion at low modulating frequencies in a plate modulation system utilizing a pi-filter method of supplying the D.C. current. A further object is to provide reduction of distortion in a less complex and far more economical manner than is now employed in the art. The present invention is featured in the unique development of a bridge circuit including the output winding of the modulation transformer, the modulation inductor, coupling capacitors and the power amplifier input resistance by the inclusion of a resistive member within the circuit with value determined as a function of the other parameters. By balancing the resulting nonfrequency selective bridge, the undesired audio voltage appearing in the power supply may be substantially reduced.

A further feature of the present invention is the formation of a nonfrequency selective bridge network utilizing the existing parameters in a known plate modulation technique by which audio distortion is reduced and which makes possible the reduction of the size of filter capacitors normally required in the plate voltage power supply. These and other features and objects of the present invention will become apparent upon reading the following description in conjunction with the accompanying drawings in which.

High-powered transmitters employing push-pull modulators generally are not designed such that the plate current for the modulated stage flows through the secondary of the modulation transformer. High current may cause a magnetic bias on the transformer sufficient to effect nonlinearity and thus introduce distortion. The pi-filter method is commonly used such that the plate current for the modulated stage flows instead through a modulation inductor, and the coupling network between the modulation transformer and the output amplifier includes a coupling capacitor such that the secondary of the modulation transformer, the coupling capacitor, and the modulation inductor form a pi-filter modulator tube load. The pi-filter method reduces the inductance requirements of the modulation transformer and the modulation inductor by a considerable factor. To obtain a similar frequency response without the pi-filter technique, the values of the transformer and the reactor inductances may have to be at least twice the values employed in the pi-filter technique. In addition, the pi-filter technique requires considerable less coupling reactance.

Figure 1:
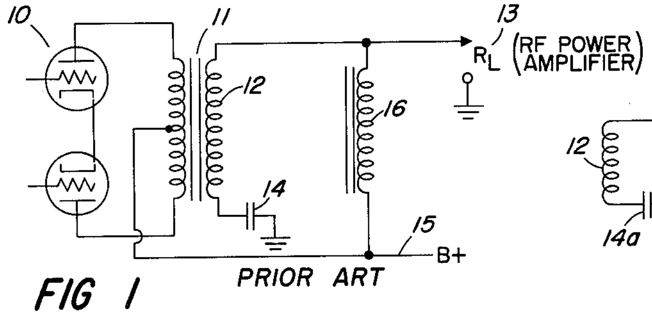
PRIOR ART FIG 1
FIGURE 1 illustrates a common method of obtaining plate modulation utilizing the pi-filter method of supplying the D.C. current.

FIGURE 1 illustrates a commonly utilized plate modulation system wherein the pi-filter method is used to supply the D.C. current. A push-pull amplifier 10 operates into a modulation transformer 11. The secondary winding 12 of transformer 11 is coupled to a power amplifier load 13 by means of coupling capacitor 14, while the plate voltage supply 15 is supplied through a modulation inductor 16 to the load 13. This scheme is recommended and more often used since it obviates the packaging and insulation problems that would be encountered should the coupling capacitor be included in the upper branch of the circuit included in FIGURE 2. The placement of capacitor 14 as shown prevents the secondary winding from being at D.C. ground which would necessitate added transformer winding insulation. In addition, one side of capacitor 14 may be grounded to facilitate packaging.

Figure 2:
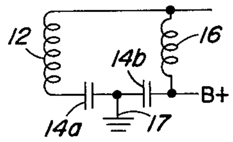
FIGURE 2 is a further expedient of arriving at the pi-filter of FIGURE 1.

In practice, the embodiment of FIGURE 1 becomes that shown in the partial schematic of FIGURE 2 wherein the coupling capacitor 14 is comprised of capacitor $14_a$ and $14_b$ with one terminal of each capacitor tied to common ground 17. Capacitor $14_b$ represents the power supply filter capacitance.

Figure 3:
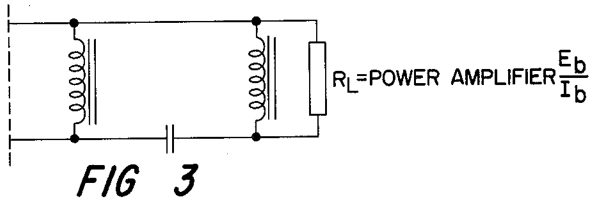
FIGURE 3 is an equivalent pi-filter modulator tube-loaded diagram.

FIGURE 3 illustrates the pi-filter modulation tube load for the modulation stage 10 and is seen to include the reaction of the modulating transformer supply winding, the reactance of the modulating inductor, the reactance of the coupling capacitor, and the input resistance of the power amplifier load.

When the pi-filter technique is utilized, low modulating frequencies may cause an audio voltage to appear on the B+ power source 15 which would aid one of the tubes of modulator 10 while opposing the other. The resulting unbalance of the modulator tube currents produces high distortion at low modulation frequencies.

It may be noted with reference to FIGURE 2 that capacitor $14_b$ shunts the B+ power source and when a conventionally filtered B+ source is employed, actually is the shunt capacitance associated with the D.C. power source filter. Thus, should the D.C. power source have any appreciable reactance, low-modulating frequencies appear as a voltage across capacitor $14_b$, and this signal is superimposed on the D.C. power source.

As above mentioned, this problem might be obviated by employing a high impedance battery source as the B+ supply. In the more common case of a rectified and filtered D.C. source, the filter capacitor may be made extremely large or, alternatively, a large member of filter capacitors may be used to reduce the impedance of the supply. In any case of a filtered source, the series elements of the filter are grounded through the rectifier to form a parallel L-C circuit which will be resonant at a low frequency and aggravate the situation by presenting a large impedance at this frequency.

From a practical standpoint, battery sources are not utilized in high-powered transmitters and the inclusion of extremely large filter capacitors or the inclusion of a large number of filter capacitors is obviously impractical.

Recognizing then, that a B+ power source generally has some appreciable impedance, and at some low frequency may provide resonance and a resulting high impedance, the present invention provides a means of "living" with this impedance by uniquely providing a modulator output coupling method whereby the development of signal voltage across capacitor $14_b$ of FIGURE 2 may be prevented.

Figures 4, 5:
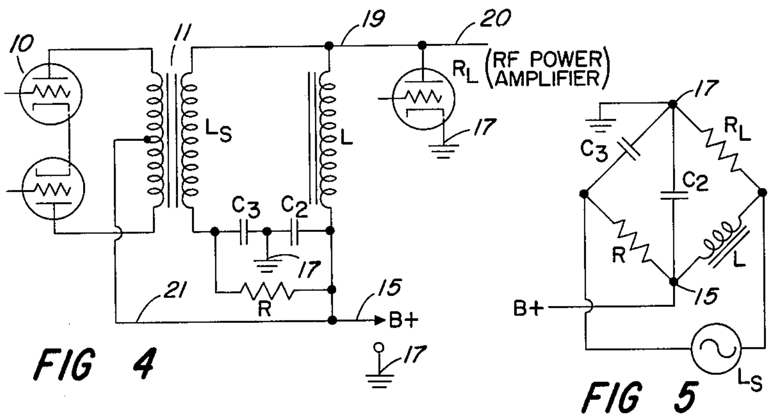
FIGURE 4 is a schematic embodiment employing the improved circuit in accordance with the present invention.
FIGURE 5 is a schematic illustration of the bridge circuit realized in the embodiment of FIGURE 4.

FIGURE 4 represents a plate modulation system in accordance with the present invention employing a modulator 10, modulation transformer 11, a modulation reactor L, a coupling capacitor $C_3$–$C_2$, in conjunction with a B+ source 15. The system developes an output 19 comprised of the audio signal superimposed on the B+ source as it is applied to the plate 20 of the power amplifier. A resistor R is connected between the ungrounded terminal of the B+ source 15 and the junction between the secondary winding $L_s$ of modulation transformer 11 and coupling capacitor $C_3$. The system includes the well-known expedient of utilizing the same B+ power source 15 for both the modulator 10 and the R.F. power amplifier 20, and thus audio signal appearing on the B+ source introduces distortion.

Considering the plate modulation system of FIGURE 4, any appreciable audio signal developed across capacitor $C_2$ is imposed on the B+ source 15 and, through the connection 21 with the push-pull modulator 10, will aid one of the tubes of modulator 10 while opposing the other. At low modulation frequencies, the reactance of capacitor $C_2$ (which may be considered as, and in any event would be effectively shunted by and thereby include, the filter capacitor associated with the plate supply 15) may become appreciable such that appreciable audio signal appears across capacitor $C_2$ and thus on the B+ source 15. The addition of the resistor member R uniquely forms a bridge circuit which includes the secondary $L_s$ of transformer 11, the modulation inductor L and the R.F. amplifier load $R_L$. Capacitor $C_2$ forms a diagonal of the bridge. By judicious choice of the value of resistor R, the bridge may be balanced to prevent the development of voltage across capacitor $C_2$. The bridge is illustrated in FIGURE 5. The B+ source 15 and the common ground 17 form a first pair of terminals, while the junction between $L_s$, $C_3$, and R, along with the junction between $R_L$ and the modulator reactor L, form a second pair of terminals to which the modulating signal from transformer secondary $L_s$ is applied.

Considering the brdige circuit, one may arrive at the following conventional proportionability in terms of a balance between junctions 17 and 15.

$$\frac{R}{X_L}=\frac{X_{C3}}{R_L}$$

$$R=\frac{X_L X_{C3}}{R_L}=\frac{\omega_L\left(\frac{1}{\omega_{C3}}\right)}{R_L}=\frac{L}{C_3 R_L}$$

From the above it is seen that R may be chosen as a value determined by L, $C_3$, and the load resistance $R_L$ such that no voltage appears across capacitor $C_2$. It may further be noted that the bridge is nonfrequency selective, and thus the balance holds regardless of frequency of the modulating voltage applied. It should be noted that the value of R to balance the bridge is, of course, the optimum case. Actually, any value of R, inserted as shown, forms the bridge and, even though the bridge is unbalanced, a lesser signal is developed across $C_2$, than without the resistors.

Figure 6:
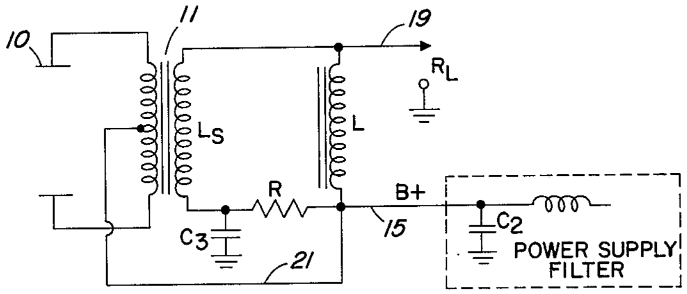
FIGURE 6 is a further representation of the present invention as embodied in FIGURE 4.

FIGURE 6 illustrates the technique of the present invention in a more familiar representation wherein the capacitor $C_2$ of the bridge is conventionally shown as the shunt filter capitance of the B+ power supply. Since the bridge balance prevents voltage appearing across capacitor $C_2$, the present invention permits a reduction in the size and use of power supply filter capacitance ($C_2$) as well as reducing the audio distortion.

The present invention was caused to be embodied in a plate modulation transmitter as illustrated in FIGURE 6 and the following measurements show a substantial reduction in distortion with that encountered at a modulating frequency of 50 cycles per second being reduced from 3% to 1.5%.

The higher distortion percentages were evidenced with resistor R omitted.

| Freq. | 5,500 watt R.F. Amp. Output @ 95% Modulation | |
|---|---|---|
| | Without R, percent | With R, percent |
| 50 | 3.0 | 1.5 |
| 100 | 1.35 | 0.81 |
| 400 | 1.1 | 0.70 |
| 1,000 | 1.1 | 0.75 |
| 5,000 | 1.2 | 0.92 |
| 7,500 | 1.2 | 0.10 |

The present invention is thus seen to provide a simple and low-cost method of reducing distortion at low modulating frequencies in plate modulated transmitters. The addition of a single resistance element effectively reduces the power supply impedance and at the same time actually permits the use of a smaller power supply filter capacitor. Although the invention has been described with respect to a particular embodiment thereof, it is not to be so limited as changes might be made therein which fall within the scope of the invention as defined by the appended claims.

I claim:

1. In a plate modulation system of the type comprising a push-pull modulator including an output transformer and coupling means connected between said output transformer and the plate circuit of a power amplifier, a source of direct current supply voltage connected to the plate circuit of said modulator and additionally through said coupling means to the plate of said power amplifier; said coupling means comprising a pi-filter network including the secondary winding of said output transformer and a modulation inductor as the shunt elements thereof, one terminal of said modulation inductor connected to a first terminal of said coupling transformer secondary winding and to the plate circuit of said power amplifier, the other terminal of said modulation inductor connected to said supply voltage source, the second terminal of said modulator transformer secondary winding connected through a coupling capacitance to the common reference of said supply voltage, said supply voltage source including a shunt capacitance to said common reference; means for reducing distortion at low modulation frequencies comprising a resistor member connected between said supply voltage source and the junction between said output transformer secondary winding and said coupling capacitance, said resistor member having a magnitude defined as $$\frac{L}{C_3 R_L}$$

where L is the inductance of said modulation inductor, $C_3$ is said coupling capacitance, and $R_L$ is the direct current plate load resistance of said power amplifier.

2. In a plate modulation system of the type comprising a modulator stage and a power amplifier stage with said modulator stage including an output transformer the secondary winding of which forms a first shunt branch of a pi-filter coupling network between said modulator stage and the plate circuit of said power amplifier stage, said pi-filter coupling network further including a second shunt branch comprising a modulation inductor, a coupling capacitance means connected between said first shunt branch and common ground, a source of direct current plate voltage likewise referred to said common ground and connected through said modulation inductor to the plate circuit of said power amplifier stage, said voltage source additionally connected to the plate circuit of said modulator stage, and further capacitance means connected between said direct current plate voltage source and said common ground reference; means for reducing distortion at low modulation frequencies comprising a resistance member connected between the respective ungrounded sides of said coupling and further capacitance means so as to comprise one leg of a bridge circuit, the other legs of said bridge circuit comprising said coupling capacitance means, said modulation inductor, and the plate load resistance of said power amplifier stage respectively; said further capacitance means being connected across a first diagonal of said bridge the terminals of which are connected to those of said direct current plate voltage source, the opposite diagonal of said bridge being connected across the secondary winding of said output transformer, and the value of said resistance member being defined as the ratio of the inductance of said modulation inductor to the product of the capacitance of said coupling capacitance and the plate load resistance of said power amplifier stage, said bridge thereby being balanced to prevent the development of signal voltage across said further capacitance.

3. In a plate modulation system of the type comprising a modulator stage and a power amplifier stage with said modulator stage including an output transformer the secondary winding of which forms a first shunt branch of a pi-filter coupling network between said modulator stage and the plate circuit of said power amplifier stage, said pi-filter coupling network further including a second shunt branch comprising a modulation inductor, a coupling capacitance means connected between said first shunt branch and common ground, a source of direct current plate voltage likewise referenced to said common ground and connected through said modulation inductor to the plate circuit of said power amplifier stage, said voltage source additionally connected to the plate circuit of said modulator stage, and further capacitance means connected between said direct current plate voltage source and said common ground reference; means for reducing distortion at low modulation frequencies comprising a resistive member, said resistive member connected between the respective ungrounded sides of said coupling and further capacitance means to thereby comprise one leg of a bridge circuit, the other legs of said bridge circuit comprising said coupling capacitance means, said modulation inductor, and the plate load resistance of said power amplifier stage respectively, said further capacitance being connected across a first diagonal of said bridge the terminals of which are connected to said source of plate voltage, the opposite diagonal of said bridge circuit being connected across the secondary winding of said output transformer, whereby a reduction in voltage of said low modulation frequencies across said further capacitance is effected.

4. In a plate modulation system of the type comprising a modulator stage and a power amplifier stage with said modulator stage including an output transformer the secondary winding of which forms a first shunt branch of a pi-filter coupling network between said modulator stage and the plate circuit of said power amplifier stage, said pi-filter coupling network further including a second shunt branch comprising a modulation inductor, a coupling capacitance means connected between said first shunt branch and common ground, a source of direct current plate voltage likewise referenced to said common ground and connected through said modulation inductor to the plate circuit of said power amplifier stage, said voltage source additionally connected to the plate circuit of said modulator stage, and further capacitance means connected between said direct current plate voltage source and said common ground reference; means for reducing distortion at low modulation frequencies comprising a resistive member, said resistive member connected between the respective ungrounded sides of said coupling and further capacitance means, said resistor having a value defined as the ratio of the inductance of said modulation inductor to the product of the capacitance of said coupling capacitor and the plate load resistance of said power amplifier stage to thereby substantially effect a balance of said bridge circuit to reduce the development of voltage at said low modulation frequencies across said further capacitance.

5. In a plate modulation system of the type comprising a modulator stage and a power amplifier stage with said modulator stage including an output transformer the secondary winding of which forms a first shunt branch of a pi-filter coupling network between said modulator stage and the plate circuit of said power amplifier stage; said pi-filter coupling network further including a second shunt branch comprising a modulation inductor, and a coupling capacitor connected to said first shunt branch and having one terminal thereof referenced to common ground, a source of direct current plate voltage likewise referenced to said common ground and connected through said modulation inductor to the plate circuit of said power amplifier stage, said voltage source additionally connected to the plate circuit of said modulator stage, and further capacitance means connected between said direct current plate voltage source and said common ground reference; means for reducing distortion at low modulation frequencies including a resistor member, said resistor member connected between the respective ungrounded sides of said coupling and said further capacitances to form a bridge network having said resistor member, said modulation inductance, said coupling capacitor, and the plate load resistance of said power amplifier stage as the respective legs thereof, said further capacitor forming a first diagonal of said bridge network and said output transformer secondary winding connected to the other diagonal of said bridge network, and said resistor member being selected in magnitude to balance said bridge independent of said modulation frequency such that no potential difference at said low modulation frequencies is developed across said further capacitor.

References Cited by the Examiner

UNITED STATES PATENTS 2,393,936 1/46 Romander ---------- 330—123 X

ROY LAKE, *Primary Examiner.*

ALFRED L. BRODY, *Examiner.*